United States Patent
Lan et al.

(10) Patent No.: US 10,214,663 B2
(45) Date of Patent: Feb. 26, 2019

(54) CHEMICAL-MECHANICAL POLISHING COMPOSITION COMPRISING ORGANIC/INORGANIC COMPOSITE PARTICLES

(71) Applicant: BASF SE, Ludwigshafen (DE)

(72) Inventors: Yongqing Lan, Ludwigshafen (DE); Bastian Marten Noller, Neuhofen (DE); Yuzhuo Li; Liang Jiang, Beijing (CN); Daniel Kwo-Hung Shen, Junghe (TW); Reza Golzarian, Portland, OR (US)

(73) Assignees: ST. LAWRENCE NANOTECHNOLOGY, Norwood, NY (US); BASF TAIWAN LTD., Taipei (TW); BASF CORPORATION, Florham Park, NJ (US)

( * ) Notice: Subject to any disclaimer, the term of this patent is extended or adjusted under 35 U.S.C. 154(b) by 0 days.

(21) Appl. No.: 15/502,932

(22) PCT Filed: Jul. 24, 2015

(86) PCT No.: PCT/IB2015/055608
§ 371 (c)(1),
(2) Date: Feb. 9, 2017

(87) PCT Pub. No.: WO2016/024177
PCT Pub. Date: Feb. 18, 2016

(65) Prior Publication Data
US 2017/0226381 A1 Aug. 10, 2017

Related U.S. Application Data

(60) Provisional application No. 62/035,533, filed on Aug. 11, 2014.

(51) Int. Cl.
*C09G 1/02* (2006.01)
*C09K 3/14* (2006.01)
*H01L 21/321* (2006.01)

(52) U.S. Cl.
CPC .............. *C09G 1/02* (2013.01); *C09K 3/1436* (2013.01); *H01L 21/3212* (2013.01)

(58) Field of Classification Search
None
See application file for complete search history.

(56) References Cited

U.S. PATENT DOCUMENTS 8,366,959 B2 2/2013 Babu et al.
8,399,579 B2 3/2013 Lohmeijer et al.
(Continued)

FOREIGN PATENT DOCUMENTS

CN 101870851 A 10/2010
EP 1 088 869 A1 4/2001
(Continued)

OTHER PUBLICATIONS

International Search Report dated Nov. 27, 2015, in PCT/IB2015/055608 filed Jul. 24, 2015.
(Continued)

*Primary Examiner* — Shamim Ahmed
(74) *Attorney, Agent, or Firm* — Oblon, McClelland, Maier & Neustadt, L.L.P.

(57) ABSTRACT

Described are a chemical-mechanical polishing (CMP) composition comprising abrasive particles in the form of organic/inorganic composite particles as well as the use of said composite particles as abrasive particles in a CMP composition and processes for the manufacture of a semiconductor device comprising chemical mechanical polishing of a substrate in the presence said CMP composition.

20 Claims, 3 Drawing Sheets

(56) References Cited

U.S. PATENT DOCUMENTS

| | | |
|---|---|---|
| 8,679,980 B2 | 3/2014 | Raman et al. |
| 8,822,340 B2 | 9/2014 | Babu et al. |
| 2002/0098701 A1* | 7/2002 | Hasegawa ............... B24B 37/24 438/692 |
| 2003/0153255 A1* | 8/2003 | Hasegawa ............... B24B 37/24 451/526 |
| 2004/0162011 A1 | 8/2004 | Konno et al. |
| 2005/0079804 A1 | 4/2005 | Taylor et al. |
| 2006/0205219 A1 | 9/2006 | Baker, III et al. |
| 2007/0049180 A1 | 3/2007 | Shida et al. |
| 2008/0318427 A1 | 12/2008 | Kunitani et al. |
| 2010/0068883 A1* | 3/2010 | Shin ........................ C09G 1/02 438/693 |
| 2011/0177690 A1* | 7/2011 | Minami ................ B24B 37/044 438/693 |
| 2012/0311935 A1* | 12/2012 | Kujat .................... B24B 37/245 51/298 |
| 2013/0248756 A1* | 9/2013 | Venkataraman ......... C09G 1/02 252/79.1 |

FOREIGN PATENT DOCUMENTS

| | | |
|---|---|---|
| EP | 1 333 476 A2 | 8/2003 |
| WO | WO 2004/063301 A1 | 7/2004 |
| WO | WO 2015/095154 A1 | 6/2015 |

OTHER PUBLICATIONS

Supplementary European Search Report dated Mar. 1, 2018 in European Patent Application No. 15 83 1838, 2 pages.
S. Armini, et al., "Copper CMP with Composite Polymer Core-Silica Shell Abrasives: A Defectivity Study", Journal of the Electrochemical Society, vol. 156 No. 1, XP055222068, Oct. 30, 2008, pp. H18-H26.

* cited by examiner

CHEMICAL-MECHANICAL POLISHING COMPOSITION COMPRISING ORGANIC/INORGANIC COMPOSITE PARTICLES

The present invention relates to a chemical-mechanical polishing (CMP) composition comprising abrasive particles in the form of organic/inorganic composite particles as well as to the use of said composite particles as abrasive particles in a CMP composition. The present invention also relates to processes for the manufacture of a semiconductor device comprising chemical mechanical polishing of a substrate in the presence of a CMP composition according to the present invention.

In the semiconductor industry, chemical mechanical polishing is a well-known technology applied in fabricating advanced photonic, micro-electromechanical and microelectronic materials and devices, such as semiconductor wafers. During the fabrication of materials and devices used in the semiconductor industry, chemical-mechanical polishing (CMP) is employed to planarize material surfaces. CMP utilizes the interplay of chemical and mechanical action to increase the planarity of the to-be-polished surfaces. Chemical as well as mechanical action is provided by a chemical-mechanical polishing composition, also referred to as a CMP composition or a CMP slurry. Polishing action is usually carried out by a polishing pad which is typically pressed onto the to-be-polished surface and mounted on a moving platen. The movement of the platen is usually linear, rotational or orbital. In a typical CMP process step, a rotating wafer holder brings the to-be-polished wafer in contact with a polishing pad. The CMP composition is usually applied between the to-be-polished wafer and the polishing pad.

In order to exert a mechanical action on the to-be-polished surface, CMP compositions typically contain abrasive particles. These particles are usually selected from the group consisting of inorganic particles, organic particles and organic/inorganic composite particles. Inorganic particles are particles each consisting of one or more inorganic materials. Organic particles are particles each consisting of one or more organic materials, wherein said organic materials are typically polymers. Organic/inorganic composite particles comprise one or more phases comprising organic materials and one or more phases comprising inorganic materials in such a way that these phases and materials are mechanically, chemically or in another way bound to each other.

Typically, a CMP composition has the consistency of a slurry. Thus, the terms CMP composition and CMP slurry are used in a synonymous manner.

CMP compositions comprising organic/inorganic composite particles are known e.g. from EP 1 088 869 A1. Said document discloses different types of organic/inorganic composite particles, namely organic particles which are evenly coated with inorganic particles, composite particles wherein a polymer is adhered or bonded to inorganic particles, or composite particles wherein a polymer film is formed on the surface of inorganic particles.

EP 1 333 476 A2 discloses CMP compositions comprising organic-inorganic composite particles which are assumed to be present in a state where one, two or more of the following features (i), (ii) and (iii) are combined, depending on the chemical nature, the particle diameter and the amount of the organic particle and the inorganic particle to be used:

(i) The state where an organic particle is a core particle, and inorganic particles (in the state of a primary particle or a secondary particle) as a shell are attached around the organic particle, to form an organic-inorganic composite particle.

(ii) The state where an inorganic particle (in the state of a primary particle or a secondary particle) is a core particle, and organic particles as a shell are attached around the inorganic particle, to form an organic-inorganic composite particle.

(iii) The state where an organic particle and an inorganic particle (in the state of a primary particle or a secondary particle) are aggregated without taking a defined core/shell structure, to form an organic-inorganic composite particle.

US 2004/0162011 A1 discloses CMP compositions comprising organic/inorganic composite particles which are prepared as follows:

(a) by polycondensation of an alkoxide compound (e.g. alkoxysilane) in the presence of organic particles (polymer particles), the resulting polycondensate being bonded to a functional group of the organic particle either directly or through an appropriate coupling agent, e.g. a silane coupling agent, (b) by bonding organic particles (polymer particles) and inorganic particles (e.g. silica) having zeta potentials of opposite polarities (positive/negative) by electrostatic force, (c) by polycondensation of an alkoxide compound (e.g. alkoxysilane) in the presence of above-defined composite particles (b), (d) by bonding silica particles on the surface of polymer particles by means of a polycondensate such as polysiloxane as a binder; or such that the functional groups of the silica particles, for example hydroxyl groups, are chemically bonded with functional groups of the polymer particles.

According to US 2004/0162011 A1 such composite particles exist in any of the following states 1 to 3:

state 1: a state that the inorganic particles have adhered as shell particles to the surfaces of core particles composed of the organic particles, state 2: a state that the organic particles have adhered as shell particles to the surfaces of core particles composed of the inorganic particles, state 3: a state that the organic particle and inorganic particles have aggregated to each other without forming a clear core-shell structure.

In each of states 1 to 3, the inorganic particles may be in any state of primary particles (non-aggregated particles) and secondary particles (formed by aggregation of primary particles, or both particles may be mixed. Alternatively the composite particles exist in a condition that a plurality of states are mixed. The state of the composite particles depends on the particle diameters and component proportions of the respective organic particles and inorganic particles forming the composite particles. Among the above-described states, states 1 and 2 are preferred according to US 2004/0162011 A1. No specific embodiment of particles existing in the above-defined state 3 is disclosed.

CMP compositions comprising similar types of organic/inorganic composite particles are disclosed in US 2007/0049180 A1 and US 2008/0318427 A1.

One of the objects of the present invention is to provide a chemical-mechanical polishing (CMP) composition suitable for use in a process for the chemical-mechanical polishing (CMP) of substrates used in the semiconductor industry, particularly for the chemical-mechanical polishing of substrates comprising a surface region or a layer consisting of copper or of a copper-based alloy.

It is a further object of the invention to increase the step height reduction efficiency (SHRE) of chemical mechanical polishing of copper. The SHRE is a measure for the planarization efficiency.

It is a further object of the invention to achieve a good trade-off between SHRE and MRR (the latter not falling below 3000 Å/min).

It is a further object of the invention to provide for a high selectivity of copper removal over materials selected from the group consisting of diffusion barrier materials and dielectric materials.

It is a further specific object of the present invention to provide abrasive particles suitable for planarization of copper patterned wafers with high efficiency when a soft pad (Hardness Shore D<30°) is used. In CMP of copper, conventionally used hard pad materials often cause defects such as micro-scratches. Especially very small chip features are at risk to get damaged by such hard pad material. As feature size of ultra large scale integrated circuit develops into 22 nm and below defects of copper interconnects become more concerned. Therefore, the semiconductor industry is going for the application of softer pad materials in CMP of copper in order to eliminate the defects caused by hard pad materials. However, to achieve high planarization efficiency on soft pad is much more difficult than on conventional hard pad material. This is due to the indentation of the substrate topography into the soft pad. Consequentially, in patterned wafer polishing, shear force difference between upper and bottom part of copper topography is small, resulting in small material removal rate difference. Since protruding structure elements (high area) as well as deepened structure elements are subject to the same polishing action (shear force) they are abraded in the same degree. Accordingly soft pad polishing is not selective towards protruding structure elements.

Furthermore, the CMP composition of the invention should have a long shelf life. In this regard, the CMP composition should be a stable formulation or dispersion where no phase separation should occur.

A related object of the invention is to provide a process for the manufacture of a semiconductor device comprising chemical mechanical polishing of a substrate, particularly of a substrate comprising a surface region or a layer consisting of copper or of a copper-based alloy.

A further object of the invention is to provide organic/inorganic composite particles suitable for the use of abrasive particles for chemical-mechanical polishing of a substrate, particularly of a substrate comprising a surface region or a layer consisting of copper of a copper-based alloy.

According to a first aspect of the present invention, a chemical-mechanical polishing (CMP) composition is provided comprising the following components:
(A) an amount of abrasive particles consisting of
    (A1) an amount of composite particles wherein each composite particle comprises
        (i) a continuous matrix phase comprising an addition polymer of one or more ethylenically unsaturated monomers
        and dispersed in said continuous matrix phase
        (ii) one or more dispersed phases each consisting of a plurality of divided phase domains consisting of inorganic solid material
    (A2) optionally an amount of further abrasive particles which are not composite particles (A1)
(B) one or more complexing agents
(C) one or more corrosion inhibitors
(D) one or more oxidizing agents
(E) water.

Constituent (A): Abrasive Particles

Constituent (A) corresponds to the totality of abrasive particles which are present in the corresponding chemical-mechanical polishing (CMP) composition according to the present invention. Thus, constituent (A) of the CMP composition according to the present invention consists of (A1) an amount of composite particles as defined above and optionally (A2) an amount of further abrasive particles which are not composite particles (A1).

In a first preferred embodiment of the present invention, constituent (A) consists of (A1) an amount of composite particles as defined above, preferably in the form of one of the preferred embodiments of constituent (A1) as described hereinbelow.

In a second preferred embodiment of the present invention, constituent (A) consists of (A1) an amount of composite particles as defined above, preferably in the form of one of the preferred embodiments of constituent (A1) as described hereinbelow, and (A2) an amount of further abrasive particles which are not composite particles (A1).

Constituent (A1): Composite Particles

As constituent (A1), the CMP composition according to the present invention comprises an amount of composite particles wherein each composite particle comprises
(i) a continuous matrix phase comprising an addition polymer of one or more ethylenically unsaturated monomers and dispersed in said continuous matrix phase
(ii) one or more dispersed phases each consisting of a plurality of divided phase domains consisting of inorganic solid material.

A dispersed phase "dispersed in said continuous matrix phase" refers to a plurality of discrete domains of one or more inorganic solid materials which are dispersed (i.e. spatially distributed) within the bulk of said continuous matrix phase so that each of said discrete domains is completely enveloped by said matrix phase. Each of the one or more dispersed phases (ii) independently from the other dispersed phases consists of a plurality of divided phase domains consisting of inorganic solid material.

Without wishing to be bound to a specific theory, it is assumed that the above-defined composite particles (A1) comprise addition-polymer coils, consisting of a plurality of interwoven addition-polymer chains, referred to as the polymer matrix, and particles of finely divided inorganic solid.

It is not excluded that in the composite particles as defined above that
    within the bulk of said continuous matrix phase (i) one or more dispersed phases each consisting of a plurality of divided phase domains consisting of organic solid material other than the above-defined addition polymer are dispersed
and/or
    on the external surface of said continuous matrix phase one or more phases are disposed, either in continuous or in dispersed form, said phases consisting of inorganic solid material or of organic solid material other than the above-defined addition polymer.

More specifically, it is not excluded that on the external surface of said continuous matrix phase (i) a continuous phase or a plurality of divided phase domains is disposed, wherein said continuous phase or said plurality of divided phase domains consist of inorganic solid material which is present in one of the dispersed phases (ii) which are dispersed in the matrix.

In a preferred embodiment of the present invention, the CMP composition according to the present invention comprises as constituent (A1) an amount of composite particles wherein each composite particle consists of
(i) a continuous matrix phase comprising an addition polymer of ethylenically unsaturated monomers
and dispersed in said continuous matrix phase
(ii) one or more dispersed phases each consisting of a plurality of divided phase domains consisting of inorganic solid material.

In another preferred embodiment of the present invention, the CMP composition according to the present invention comprises as constituent (A1) an amount of composite particles wherein each composite particle comprises or consists of
(i) a continuous matrix phase comprising an addition polymer of ethylenically unsaturated monomers
and dispersed in said continuous matrix phase
(ii) a dispersed phase each consisting of a plurality of divided phase domains consisting of inorganic solid material.

Preferably, in the above-defined composite particles, the divided phase domains of one, more than one or all of said dispersed phases (ii) have a longest dimension which is 25% or less, preferably 15% or less of the average particle size of the composite particles (A1).

The dimensions of said divided phase domain generally correspond to the dimensions of the particles of inorganic solid material used for the preparation of the above-defined composite particles (see below).

The total amount of constituent (A1) is preferably not more than 1.5 wt.-%, more preferably not more than 0.5 wt.-%, in each case based on the total weight of the respective CMP composition of the present invention. The total amount of constituent (A1) is preferably at least 0.05 wt.-%, more preferably at least 0.1 wt.-%, in each case based on the total weight of the respective CMP composition of the present invention.

Suitable ethylenically unsaturated monomers in accordance with the invention include all those which are easy to polymerize in a free radical-mechanism in aqueous medium and are commonly used in the method of aqueous emulsion polymerization. They include ethylene; vinylaromatic monomers, such as styrene, α-methylstyrene, o-chlorostyrene and vinyltoluenes; esters of vinyl alcohol and $C_1$-$C_{15}$ monocarboxylic acids, such as vinyl acetate, vinyl propionate, vinyl n-butyrate, vinyl laurate and vinyl stearate; esters of preferably $C_3$-$C_6$ α,β-monoethylenically unsaturated mono- and dicarboxylic acids, such as especially acrylic acid, methacrylic acid, maleic acid, fumaric acid and itaconic acid, with generally $C_1$-$C_{12}$, preferably $C_1$-$C_5$ and, in particular, $C_1$-$C_4$ alkanols, such as, in particular, methyl (meth)acrylate, ethyl (meth)acrylate, n-butyl (meth)acrylate, isobutyl (meth)acrylate and 2-ethylhexyl (meth)acrylate (herein, the term "(meth)acrylic" includes "methacrylic" and "acrylic"); dimethyl maleate and di-n-butyl maleate, nitriles of a α,β-monoethylenically unsaturated carboxylic acids, such as acrylonitrile, and conjugated $C_{4-5}$-dienes, such as 1,3-butadiene and isoprene. As a general rule, these monomers are only of moderate to poor solubility in water at 25° C. and atmospheric pressure (1 atm absolute), i.e. ≤10 g, preferably ≤5 g, and more preferably ≤2 g per 100 g of deionized water. For further details, see US 2012/0016060, especially paragraphs [0041]-[0061].

More preferably, the continuous matrix phase (i) of said composite particles (A1) comprises or consists of an addition polymer selected from the group consisting of (meth)acrylic polymers. Herein, the term "(meth)acrylic" includes "methacrylic" and "acrylic".

Preferably the divided phase domains of one, more than one or all of said dispersed phases (ii) consist of inorganic solid material selected from the group consisting of silicon dioxide, phyllosilicates, aluminum oxide, hydroxyaluminum oxide, calcium carbonate, magnesium carbonate, calcium orthophosphate, magnesium orthophosphate, iron(II) oxide, iron (III) oxide, iron(II/III) oxide, tin(IV) oxide, cerium(IV) oxide, yttrium(III) oxide, titanium dioxide, hydroxylapatite, zinc oxide, and zinc sulfide.

Further preferably one of said dispersed phases (ii) consists of silicon dioxide (silica). Especially preferably, there is only one dispersed phase dispersed in said continuous matrix phase, said dispersed phase consisting of a plurality of divided phase domains consisting of silicon dioxide.

Particularly preferably, in the amount of composite particles (A1) each composite particle comprises
(i) a continuous matrix phase comprising an addition polymer selected from the group of (meth)acrylic polymers and dispersed in said continuous matrix phase
(ii) one dispersed phase consisting of a plurality of divided phase domains consisting of silicon dioxide.

Preferably, said composite particles (A1) have an average particle size in the range of from more than 10 nm to not more than 1000 nm, preferably of from 25 to 500 nm, and more preferably of from 50 to 250 nm and/or the divided phase domains of one, more than one or all of said dispersed phases (ii) each consist of a particle of inorganic solid material having an average particle size of more than 0 nm, preferably of 5 nm or more, but not more than 100 nm, preferably not more than 50 nm.

Further preferably, said composite particles (A1) have an average particle size in the range of from more than 10 nm to not more than 1000 nm, preferably of from 25 to 500 nm, and more preferably of from 50 to 250 nm and the divided phase domains of one, more than one or all of said dispersed phases (ii) each consist of a particle of inorganic solid material having an average particle size of more than 0 nm, preferably of 5 nm or more, but not more than 100 nm, preferably not more than 50 nm.

The average particle sizes of the composite particles (A1) as defined above as well as of the particles of inorganic solid material which in the composite particles (A1) form the divided phase domains of said dispersed phases (ii) are determined by the method of photon correlation spectroscopy (also referred to as quasi-elastic light scattering QELS) according to DIN ISO 13321 using a High Performance Particle Sizer (HPPS) from Malvern Instruments Ltd.

Preferably, the chemical-mechanical polishing composition according to the present invention comprises an amount of composite particles (A1) obtainable by a process for preparing an aqueous dispersion comprising an amount of composite particles (A1)
wherein in said process one or more ethylenically unsaturated monomers are dispersely distributed in an aqueous medium and polymerized by the method of free-radical aqueous emulsion polymerization by means of one or more free-radical polymerization initiators in the presence of one or more dispersed phases each consisting of a plurality of divided phase domains consisting of inorganic solid material, and one or more dispersants, said process comprising the steps of a) providing
   an aqueous medium
   an amount of one or more ethylenically unsaturated monomers
   one or more inorganic solid materials having an average particle size of 100 nm or below in a total amount of 1% to 1000% by weight of the total amount of said one or more ethylenically unsaturated monomers,
   and
   one or more free-radical polymerization initiators in a total amount of 0.05% to 2% by weight of the total amount of said one or more ethylenically unsaturated monomers,
b) including in an initial charge at least a portion of said one or more inorganic solid materials into said aqueous medium so that an aqueous dispersion comprising one or more dispersed phases each consisting of a plurality of divided phase domains consisting of inorganic solid material is formed
c) subsequently metering into the aqueous dispersion formed in step b)
   0.01% to 20% by weight of the total amount of said one or more ethylenically unsaturated monomers provided in step a) and
   60% by weight or more of the total amount of said one or more free-radical polymerization initiators provided in step a)
   and polymerizing under polymerization conditions the one or more ethylenically unsaturated monomers metered in, up to a monomer conversion of 80% by weight or more (polymerization stage 1) so that a polymerization mixture is formed,
d) subsequently, under polymerization conditions metering into the polymerization mixture formed in step c)
   any remainder of said one or more inorganic solid materials
   any remainder of said one or more free-radical polymerization initiators, and
   the remainder of said one or more ethylenically unsaturated monomers and carrying out polymerization to a monomer conversion of 90% or more by weight of the monomers metered in step d) (polymerization stage 2).

A process for preparing an aqueous dispersion of composite particles (as defined above) suitable for a CMP composition according to the present invention is described in US 2012/0016060.

More specifically, said aqueous dispersion of composite particles is obtainable by a process according to US 2012/0016060, said process comprising
   distributing at least one ethylenically unsaturated monomer dispersely in aqueous medium; and
   polymerizing the at least one monomer by free-radical aqueous emulsion polymerization with at least one free radical polymerization initiator in the presence of at least one dispersely distributed, finely divided inorganic solid and at least one dispersant,
a) wherein 1% to 1000%, preferably ≥50%, by weight of an inorganic solid having an average particle size≤100 nm and 0.05% to 2% by weight of a free-radical polymerization initiator, based on a total amount of ethylenically unsaturated monomers, which is a total amount, is employed,
b) wherein at least a portion of the inorganic solid is comprised in an initial charge into the aqueous medium polymerization form in the form of an aqueous dispersion of solids, subsequently
wherein, after the initial charge, the polymerizing comprises
c) metering a total of ≥0.01% and ≤20%, preferably ≥1% and ≤15%, by weight of the total monomer amount and ≥60%, preferably ≥70%, by weight of a total amount of the free-radical polymerization initiator into the aqueous dispersion of solids resulting after the initial charge, and polymerizing the at least one ethylenically unsaturated monomer metered in, under polymerization conditions, up to a monomer conversion of ≥80% by weight,
and subsequently
d) metering any remainder of the inorganic solid, any remainder of the free-radical polymerization initiator, and the remainder of the at least one ethylenically unsaturated monomer into a resultant polymerization mixture under polymerization conditions, and carrying out polymerization to a monomer conversion of 90% by weight.

In particular, said aqueous dispersion of composite particles is obtainable by a process comprising the steps of
   distributing at least one ethylenically unsaturated monomer dispersely in aqueous medium; and
   polymerizing the at least one monomer by free-radical aqueous emulsion polymerization with at least one free-radical polymerization initiator in the presence of at least one dispersely distributed, finely divided inorganic solid and at least one dispersant,
a) wherein 1% to 1000% preferably ≥50%, by weight of an inorganic solid having an average particle size≤100 nm and 0.05% to 2% by weight of a free-radical polymerization initiator, based on a total amount of ethylenically unsaturated monomers, are employed,
b) wherein at least a portion of the inorganic solid is comprised in an initial charge into the aqueous medium polymerization form in the form of an aqueous dispersion of solids, subsequently
wherein, after the initial charge, the polymerizing comprises
c) metering a total of ≥0.01% and ≥20%, preferably ≥1% and ≤15%, by weight of the total monomer amount while metering ≥60%, preferably ≥70%, by weight of a total amount of the free-radical polymerization initiator into the aqueous dispersion of solids resulting after the initial charge, and polymerizing the at least one ethylenically unsaturated monomer metered in, under polymerization conditions, up to a monomer conversion of ≥80% by weight,
and subsequently
d) metering any remainder of the inorganic solid, any remainder of the free-radical polymerization initiator, and the remainder of the at least one ethylenically unsaturated monomer into a resultant polymerization mixture under polymerization conditions, and carrying out polymerization to a monomer conversion of ≤90% by weight,
and wherein the polymerizing steps c) and d) generate the aqueous composite-particle dispersion having a coagulum content of ≤0.5% by weight.

The aqueous medium is preferably de-ionized water.

Preferably, the inorganic solid materials comprise at least one selected from the group consisting of pyrogenic (fumed) silica, colloidal silica, and phyllosilicates. These finely divided inorganic solid materials are used in the above-defined process either in the form of powders or in the form of stable aqueous dispersions of solids, referred to as sols. For further details, see US 2012/0016060, especially paragraphs [0018]-[0026].

The inorganic solid material used in the above-defined process has an average particle size of more than 0 nm, preferably of 5 nm or more, and not more than 100 nm, preferably not more than 90 nm, more preferably not more than 80 nm, further preferably not more than 70 nm, more preferably not more than 60 nm, particularly preferably not more than 50 nm, determined by the method of photon correlation spectroscopy (also referred to as quasi-elastic light scattering QELS) according to DIN ISO 13321 using a High Performance Particle Sizer (HPPS) from Malvern Instruments Ltd. For further details, see US 2012/0016060, especially paragraphs [0021] and [0077].

Preferably, in step b), the total amount of the inorganic solid materials is comprised in the initial charge.

Any initiators which are suitable for the initiation of the free-radical polymerization, i.e. which are capable of triggering a free-radical aqueous emulsion polymerization, can be used. Typically the initiators are selected from the group consisting of peroxides and azo compounds. For further details, see US 2012/0016060, especially paragraphs [0062]-[0063].

The term "polymerization conditions" herein refers to those temperatures and pressures under which the free-radically initiated aqueous emulsion polymerization proceeds with a sufficient polymerization rate. The polymerization conditions are dependent more particularly on the free-radical initiator that is used. Advantageously the nature and amount of the free-radical initiator, the polymerization temperature, and the polymerization pressure are selected in steps c) and d) of the process such that the free-radical initiator used has an adequate half-life, while at the same time always providing starting free radicals sufficient to initiate and maintain the polymerization reaction. In steps c) and d) of the process suitable reaction temperatures for the free-radical aqueous emulsion polymerization reaction in the presence of the finely divided inorganic materials embrace the entire range from 0° C. to 170° C. In general, the temperatures used are from 50° C. to 120° C., frequently 60° C. to 110° C. and often 70° C. to 100° C. The free-radical aqueous emulsion polymerization can be conducted at a pressure less than, equal to or greater than atmospheric pressure. For further details, see US 2012/0016060, especially paragraph [0070].

The determination of the monomer conversion is familiar in principle to the skilled worker and is accomplished, for example, by reaction-calorimetry determinations. For further details, see US 2012/0016060, especially paragraph [0067].

During the above-described process, said dispersant maintains not only the finely divided inorganic solid particles but also the monomer droplets and the resulting composite particles in disperse distribution in the aqueous polymerization medium and so ensures the stability of the aqueous dispersions of composite particles that are produced. Suitable dispersants include protective colloids commonly used to carry out free-radical aqueous emulsion polymerizations, and emulsifiers. Preferably, the dispersant comprises at least one selected from the group consisting of an anionic emulsifier and a non-ionic emulsifier. For further details, see US 2012/0016060, especially paragraphs [0029]-[0040].

The aqueous composite-particle dispersions obtainable by the above-defined process normally have a total solids content of 1% or more, and 70% or less, frequently of 5% or more and 65% or less, and often 10% or more and 60% or less, by weight.

The composite particles obtainable by the above-defined process generally have average particle sizes of >10 nm and not more than 1000 nm, frequently ≥25 and ≤500 nm, and often ≥50 and ≤250 nm determined by the method of photon correlation spectroscopy (also referred to as quasi-elastic light scattering QELS) according to DIN ISO 13321 using a High Performance Particle Sizer (HPPS) from Malvern Instruments Ltd. For further details, see US 2012/0016060, especially paragraph [0077].

For further details and preferred embodiments of the above-mentioned processes, reference is made to US 2012/0016060, especially paragraphs [0027], [0028] and [0064]-[0075].

Aqueous dispersions of composite particles formed by the process disclosed in US 2012/0016060 are stable and have a low coagulum content, generally 0.5 wt.-% or less, preferably 0.1 wt.-% or less, and with particular preference 0.05 wt.-% or less, based in each case on the total weight of the aqueous composite-particle dispersion. The coagulum content is determined by filtering the aqueous composite-particle dispersion through a nylon sieve having a mesh size of 45 µm. For further details, see US 2012/0016060, especially paragraphs [0080]-[0081].

Regarding the use of such aqueous dispersions of composite particles for the preparation of a CMP composition, a low coagulum content is advantageous because a low tendency of the composite particles to coagulate increases the shelf life of the CMP composition.

Surprisingly it has been found that chemical-mechanical polishing compositions comprising the above-defined composite particles (A1), especially in its preferred embodiments, are capable of achieving the above-defined objects of the present invention.

Constituent (A2): further abrasive particles which are not composite particles (A1)

Optionally, a chemical-mechanical polishing (CMP) composition according to the present invention comprises as constituent (A2) an amount of further abrasive particles which are not composite particles (A1). Constituent (A2) corresponds to the totality of abrasive particles present in a CMP composition according to the present invention which are not composite particles (A1) as defined above.

Any conventionally used abrasive particles may be used as abrasive particles (A2).

Particles for use as or in constituent (A2) are
preferably inorganic particles,
more preferably particles selected from the group consisting of oxides and carbides of metals or metalloids, or a mixture or composite thereof,
most preferably particles selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, zirconia, and mixtures and composites thereof,
particularly preferably particles selected from the group consisting of alumina, ceria, silica, titania, zirconia, and mixtures and composites thereof,
in particular silica particles,
for example colloidal silica particles.

If constituent (A2) includes organic particles, polymer particles are preferred as organic particles.

Constituent (A2) may also comprise composite particles which are not composite particles (A1), e.g. core shell particles as disclosed in the prior art.

Furthermore, constituent (A2) may be present in the form of a mixture of different kinds of abrasive particles which are not composite particles (A1).

Preferably, the average particle size of the particles of constituent (A2) is in the range of from 5 to 500 nm, more preferably in the range of from 10 nm to 400 nm, most preferably in the range of from 20 nm to 300 nm, in particular in the range of from 30 nm to 160 nm, for example in the range of from 35 nm to 135 nm, in each case as measured with dynamic light scattering techniques using instruments such as High Performance Particle Sizer (HPPS) from Malvern Instruments, Ltd. or Horiba LB550.

The particles of constituent (A2) can be of various shapes. Thereby, the particles of constituent (A2) may be of one or essentially only one type of shape. However, it is also possible that the particles of constituent (A2) have different shapes. For instance, two types of differently shaped particles may be present. For example, particles used in or as constituent (A2) can have the shape of cubes, cubes with chamfered edges, octahedrons, icosahedrons, cocoons, nodules or spheres with or without protrusions or indentations. Preferably, they are spherical with no or only very few protrusions or indentations.

Any abrasive particles which are present in the CMP composition which are not composite particles (A1) as defined above must be assigned to constituent (A2).

If present, the total amount of constituent (A2) is preferably not more than 1.5 wt.-%, more preferably not more than 0.5 wt.-%, in each case based on the total weight of the respective CMP composition of the present invention. The total amount of constituent (A2) is preferably at least 0.05 wt.-%, more preferably at least 0.1 wt.-%, in each case based on the total weight of the respective CMP composition of the present invention.

Constituent (B): Complexing Agent(s)

A chemical-mechanical polishing (CMP) composition according to the present invention comprises as constituent (B) one or more complexing agents. A complexing agent used in or as constituent (B) is a compound that forms a soluble complex with certain metal ions, thereby inactivating said metal ions so that they cannot normally react with other elements or ions to produce precipitates or scale.

Preferably, the complexing agent or at least one of the complexing agents of constituent (B) is selected from the group consisting of organic acids and inorganic acids.

Among organic acids, amino acids and carboxylic acids are preferred. Preferred amino acids are selected from the group consisting of glycine, arginine, lysine, alanine, leucine, valine, histidine, cysteine, serine and proline. Preferred carboxylic acids are selected from the group consisting of formic acid, acetic acid, malonic acid, oxalic acid, citric acid, succinic acid and tartaric acid. Among the inorganic acids, phosphoric acid is preferred.

The total amount of constituent (B) is preferably not more than 5 wt.-%, more preferably not more than 3 wt.-%, most preferably not more than 2 wt.-%, in each case based on the total weight of the respective CMP composition of the present invention. The total amount of constituent (B) is preferably at least 0.05 wt.-%, more preferably at least 0.10 wt.-%, most preferably at least 0.2 wt.-%, in each case based on the total weight of the respective CMP composition of the present invention.

Substances which because of their structure at the same time fall under the definition of various constituents of a CMP composition according to the invention for quantitative considerations must be assigned in each case to all these constituents. For example, where a composition according to the invention contains in or as constituent (B) one or more complexing agents which at the same time fall under the definition of any other constituent defined herein, for the purpose of quantitative considerations these complexing agents must be assigned to constituent (B) as well as said other constituent(s).

Constituent (C): One or More Corrosion Inhibitors

A chemical-mechanical polishing (CMP) composition according to the present invention comprises as constituent (C) one or more corrosion inhibitors. A corrosion inhibitor used in or as constituent (C) is a compound which is capable of controlling the corrosion of the surface of metal. Typically, such a corrosion inhibitor adheres to the surface to be polished and thereby forms a protective film, typically a molecular film.

Preferably, the corrosion inhibitors or at least one of the corrosion inhibitors of constituent (C) is selected from the group consisting of heterocyclic aromatic compounds comprising at least one, preferably three or four nitrogen atoms in the aromatic ring system. Further preferably, the corrosion inhibitors or at least one of the corrosion inhibitors of constituent (C) is selected from the group consisting of azoles. Most preferably, the corrosion inhibitors or at least one of the corrosion inhibitors of constituent (C) is selected from the group consisting of benzotriazole, methyl-benzotriazole, 1,2,4-triazole, pyrrolidone, imidazole, poly vinyl pyrrolidone, poly vinyl imidazole, tetrazole, 1,2,3-triazole, 5-phenyl tetrazole, 3-amino-1,2,4-triazole, benzimidazole.

The total amount of constituent (C) is preferably not more than 0.5 wt.-%, more preferably not more than 0.3 wt.-%, most preferably not more than 0.2 wt.-%, in each case based on the total weight of the respective CMP composition of the present invention. The total amount of constituent (C) is preferably at least 0.001 wt.-%, more preferably at least 0.005 wt.-%, most preferably at least 0.01 wt.-%, in each case based on the total weight of the respective CMP composition of the present invention.

Substances which because of their structure at the same time fall under the definition of various constituents of a CMP composition according to the invention for quantitative considerations must be assigned in each case to all these constituents. For example, where a composition according to the invention contains in or as constituent (C) one or more corrosion inhibitors which at the same time fall under the definition of any other constituent defined herein, for the purpose of quantitative considerations these corrosion inhibitors must be assigned to constituent (C) as well as said other constituent(s).

Constituent (D): One or More Oxidizing Agents

The chemical-mechanical polishing (CMP) composition of the present invention further comprises as constituent (D) one or more oxidizing agents. An oxidizing agent used in or as constituent (D) is a compound which is capable of oxidizing the to-be-polished substrate or one of its layers.

Preferably the oxidizing agent or at least one of the oxidizing agents of constituent (D) is selected from the group consisting of peroxides, for example hydrogen peroxide, persulfates, perchlorates, perbromates, periodates and permanganates.

The total amount of constituent (D) is preferably not more than 2 wt.-%, more preferably not more than 1.8 wt.-%, most preferably not more than 1.5 wt.-%, in each case based on the total weight of the respective CMP composition of the present invention. The total amount of constituent (D) is preferably at least 0.1 wt.-%, more preferably at least 0.3 wt.-%, most preferably at least 0.5 wt.-%, in each case based on the total weight of the respective CMP composition of the present invention.

Substances which because of their structure at the same time fall under the definition of various constituents of a CMP composition according to the invention for quantitative considerations must be assigned in each case to all these constituents. For example, where a composition according to the invention contains in or as constituent (D) one or more oxidizing agents which at the same time fall under the definition of any other constituent defined herein, for the purpose of quantitative considerations these oxidizing agents must be assigned to constituent (D) as well as said other constituent(s).

Constituent (E): Water, and Optional Further Constituents

The CMP composition according to the present invention comprises as constituent (E) water. Most preferably, de-ionized water is used for making a CMP composition according to the invention.

Beside above-defined constituents (A)-(E), the CMP composition according to the present invention optionally comprises an organic solvent miscible with water (e.g. an alcohol, preferably a $C_1$ to $C_3$ alcohol, or an alkylene glycol derivative).

If the amounts of the constituents other than water (E) are in total x % by weight of the CMP composition, then the amount of (E) is (100−x) % by weight of said CMP composition.

pH Value of the CMP Composition

The properties of the chemical-mechanical polishing (CMP) composition of the present invention, such as stability and polishing performance, may depend on the pH of said composition.

Preferably, the pH value of the composition is not more than 9, more preferably not more than 8, most preferably not more than 7. The pH value of the composition is preferably at least 4, more preferably at least 4.5, most preferably at least 5.

In the process of preparing a chemical-mechanical polishing (CMP) composition of the present invention, the pH value of said CMP composition is optionally adjusted by adding one or more additional pH adjusting agents (F). In general, a pH adjusting agent for use in preparation of a CMP composition of the present invention is a compound which is added to the CMP composition to have its pH value adjusted to the required value.

A chemical-mechanical polishing (CMP) composition having a pH in the above-defined range is obtainable by mixing
 (F) one or more pH adjusting agents
 with the constituents (A), (B), (C), (D) and (E) of the chemical-mechanical polishing composition.

Preferably, said one or at least one of the more than one pH adjusting agents (F) is selected from the group consisting of inorganic acids, carboxylic acids, amine bases, alkali hydroxides and ammonium hydroxides, including tetraalkylammonium hydroxides. Particularly preferably, said one or at least one of the more than one pH adjusting agents (F) is selected from the group consisting of nitric acid, and potassium hydroxide. Most preferably, the pH adjusting agents (F) are nitric acid and potassium hydroxide.

Substances which because of their structure at the same time fall under the definition of various constituents of a CMP composition according to the invention for quantitative considerations must be assigned in each case to all these constituents. For example, where a composition according to the invention contains in or as constituent (F) one or more pH adjusting agents which at the same time fall under the definition of any other constituent defined herein, for the purpose of quantitative considerations these pH adjusting agents must be assigned to constituent (F) as well as said other constituent(s).

The total amount of pH adjusting agents (F) added in the process of preparing a CMP composition of the present invention is preferably not more than 10 wt.-%, more preferably not more than 2 wt.-%, most preferably not more than 0.5 wt.-%, in each case based on the total weight of the respective CMP composition of the present invention. If present, the total amount of pH adjusting agents (F) added in the process of preparing the CMP composition of the present invention is preferably at least 0.0005 wt.-%, more preferably at least 0.005 wt.-%, most preferably at least 0.025 wt.-%, in each case based on the total weight of the respective CMP composition of the present invention.

Preparation of the CMP Composition

Processes for preparing chemical mechanical polishing (CMP) compositions are generally known. These processes are applicable to the preparation of the CMP composition of the present invention. A CMP composition of the present invention is preparable by dispersing or dissolving the above described constituents (A), (B), (C) and (D) in an aqueous medium, preferably water (E), and optionally adjusting the pH value by adding one or more pH adjusting agents (F). Thus, the CMP composition is preferably preparable by dispersing the composite particles (A), and dispersing and/or dissolving the further constituents (B), (C) and (D) and one or more pH adjusting agents (F) in an aqueous medium, preferably water (E). For this purpose, the customary and standard mixing processes and mixing apparatuses such as agitated vessels, high shear impellers, ultrasonic mixers, homogenizer nozzles or counterflow mixers, are usable.

Especially preferred are CMP compositions according to the present invention wherein two or more of the above-defined preferred features are combined. Further preferably, one, two, three or each of constituents (A) to (D) of the CMP composition according to the present invention is present in the form of one of the preferred embodiments of said constituent and/or in the preferred concentration range of said constituent.

A preferred CMP composition according to the present invention comprises
(A1) a total amount of composite particles wherein each composite particle comprises
 (i) a continuous matrix phase comprising an addition polymer of one or more ethylenically unsaturated monomers
 and dispersed in said continuous matrix phase
 (ii) one or more dispersed phases each consisting of a plurality of divided phase domains consisting of inorganic solid material
 in a range of from 0.05 to 1.5 wt.-% based on the total weight of the respective chemical-mechanical polishing composition, preferably in a range of 0.1 to 0.5 wt.-%,
and/or
(B) a total amount of one or more complexing agents in a range of from 0.05 to 5 wt.-% based on the total weight of the respective CMP composition,
and/or
(C) a total amount of one or more corrosion inhibitors in a range of from 0.001 to 0.5 wt.-% based on the total weight of the respective CMP composition,
and/or
(D) a total amount of one or more oxidizing agents in a range of from 0.1 to 2 wt.-% based on the total weight of the respective CMP composition.

A particularly preferred CMP composition according to the present invention comprises
(A1) a total amount of composite particles wherein each composite particle comprises
 (i) a continuous matrix phase comprising an addition polymer of one or more ethylenically unsaturated monomers and dispersed in said continuous matrix phase
(ii) one or more dispersed phases each consisting of a plurality of divided phase domains consisting of inorganic solid material
in a range of from 0.05 to 1.5 wt.-% based on the total weight of the respective chemical-mechanical polishing composition, preferably in a range of 0.1 to 0.5 wt.-%, and
(B) a total amount of one or more complexing agents in a range of from 0.05 to 5 wt.-% based on the total weight of the respective CMP composition, and
(C) a total amount of one or more corrosion inhibitors in a range of from 0.001 to 0.5 wt.-% based on the total weight of the respective CMP composition, and
(D) a total amount of one or more oxidizing agents in a range of from 0.1 to 2 wt.-% based on the total weight of the respective CMP composition.

Regarding preferred features of the individual constituents of said CMP composition, reference is made to the disclosure given above.

Regarding the quantitative characterization of a composition according to the present invention (as defined above), substances which because of their structure at the same time fall under the definition of various constituents of a CMP composition according to the invention must be assigned in each case to all these constituents.

Chemical Mechanical Polishing (CMP) Process:

A further aspect of the present invention relates to process for the manufacture of a semiconductor device comprising chemical mechanical polishing of a substrate
by means of a chemical mechanical polishing composition according to the present invention as defined above
or
in the presence of an amount of composite particles (A1)
wherein each composite particle comprises
(i) a continuous matrix phase comprising an addition polymer of one or more ethylenically unsaturated monomers
and dispersed in said continuous matrix phase
(ii) one or more dispersed phases each consisting of a plurality of divided phase domains consisting of inorganic solid material
as abrasive particles.

Regarding preferred features of the CMP composition to be used in the process according to the present invention and the individual constituents of said CMP composition, reference is made to the disclosure given above.

Regarding preferred features of the above-defined composite particles (A1), reference is made to the disclosure given above.

Preferably, in the process according to the present invention, the substrate comprises a surface region or a layer consisting of copper or of a copper alloy. Further preferably, the substrate comprises
a surface region or a layer consisting of copper or a copper alloy, and
a surface region or a layer consisting of a material selected from the group consisting of diffusion barrier materials and dielectric materials.

The symbol Cu and the term copper as used in the present disclosure refers to high purity elemental copper. The term "copper-based alloy" or "Cu-based alloy" refers to an alloy containing at least 80 wt.-% copper. When Cu or Cu-base alloys are used for metallization it is generally necessary to provide a diffusion barrier between the Cu or Cu-base alloy metallization feature and the adjacent thin layers of dielectric insulation material (interlayer dielectric (ILD) or intermetal dielectric (IMD). Typical diffusion barrier materials are selected from the group consisting of tantalum, tantalum nitride, titanium, titanium nitride, cobalt and ruthenium. Typical dielectric materials are selected from the group consisting of silicon dioxide (preferably silicon oxide obtained by plasma-enhanced chemical vapor deposition (CVD) using tetraethoxysilane (TEOS) as precursor), and low-K dielectrics with K value in the range of from 2.5 to 3.5.

The chemical mechanical polishing (CMP) process is generally known and can be carried out with the techniques and the equipment under the conditions customarily used for the CMP process in the fabrication of wafers with integrated circuits. There is no restriction on the equipment with which the polishing process can be carried out.

As is known in the art, typical equipment for the CMP process consists of a rotating platen which is covered with a polishing pad. Orbital polishers may be used, too. The wafer is mounted on a carrier or chuck. The side of the wafer being processed is facing the polishing pad (single side polishing process). A retaining ring secures the wafer in the horizontal position.

Below the carrier, the larger diameter platen is generally horizontally positioned and presents a surface parallel to that of the wafer to be polished. The polishing pad on the platen contacts the wafer surface during the planarization process.

With the CMP composition of the present invention (as defined above) preferably a soft pad having a Shore D-Hardness below 30° is used, preferably a soft pad having a Shore A hardness of from 20 to 60°.

To produce the desired material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used. They are usually designed with a number of different chambers that can be loaded to a certain degree independently from each other.

For further details of a CMP process, reference is made to WO 2004/063301 A1, in particular page 16, paragraph [0036] to page 18, paragraph [0040] in conjunction with FIGS. 1 and 2.

Further aspects of the present invention:

Another aspect of the present invention relates to the use of a chemical-mechanical polishing composition comprising (A) an amount of abrasive particles consisting of
  (A1) an amount of composite particles, wherein each composite particle comprises
    (i) a continuous matrix phase comprising an addition polymer of one or more ethylenically unsaturated monomers,
    and dispersed in said continuous matrix phase
    (ii) one or more dispersed phases each consisting of a plurality of divided phase domains consisting of inorganic solid material
  (A2) optionally an amount of further abrasive particles which are not composite particles (A1)
(B) one or more complexing agents
(C) one or more corrosion inhibitors
(D) one or more oxidizing agents
(E) water
for chemical mechanical polishing of a substrate.

Regarding preferred features of the CMP composition to be used in the process according to the present invention and the individual constituents thereof, preferred features of the chemical mechanical polishing process and preferred features of the substrates to be polished reference is made to the disclosure given above.

Another aspect of the present invention relates to the use of an amount of composite particles (A1) wherein each composite particle comprises
(i) a continuous matrix phase comprising an addition polymer of one or more ethylenically unsaturated monomers
and dispersed in said continuous matrix phase
(ii) one or more dispersed phases each consisting of a plurality of divided phase domains consisting of inorganic solid material
as abrasive particles for chemical-mechanical polishing.

Regarding preferred features of the above-defined composite particles (A1), reference is made to the disclosure given above.

EXAMPLES

The invention is hereinafter further illustrated by means of examples and figures.

The figures show.

PREPARATION OF COMPOSITE PARTICLES (A1)

An aqueous dispersion of composite particles (A1) wherein each composite particle comprises
(i) a continuous matrix phase comprising an addition polymer selected from the group consisting of (meth)acrylic polymers
and dispersed in said continuous matrix phase
(ii) a dispersed phase consisting of a plurality of divided phase domains consisting of silicon dioxide (silica)
was prepared according to the process described in US 2012/0016060. Said composite particles (A1) have an average particle size of 95 nm. The inorganic solid material is silica having a primary particle size of 15 nm and an average particle size of 30 nm due to the presence of aggregated particles. The average particle sizes of said composite particles (A1) as well as of the silica particles which in said composite particles (A1) form the divided phase domains of said dispersed phase (ii) are determined by the method of photon correlation spectroscopy (also referred to as quasi-elastic light scattering QELS) according to DIN ISO 13321 using a High Performance Particle Sizer (HPPS) from Malvern Instruments Ltd.

Figure 1:
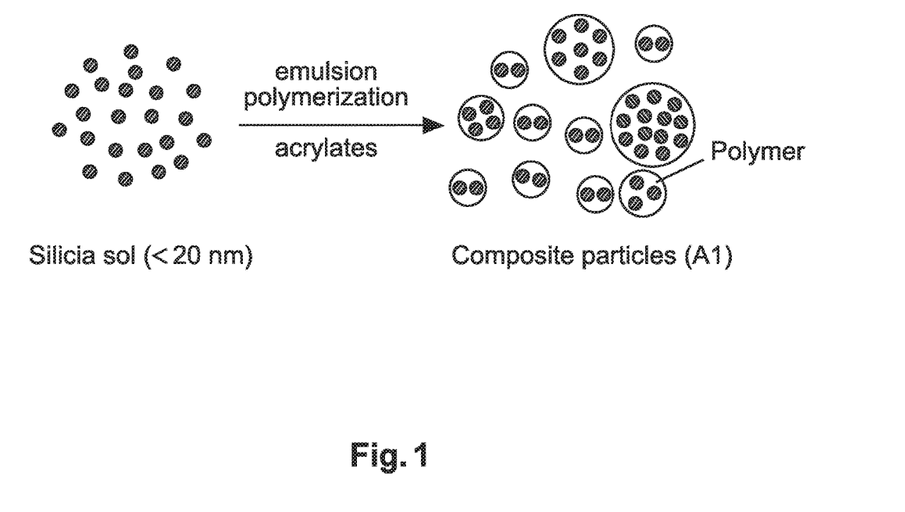
FIG. 1 a schematic representation of the process for preparing an aqueous dispersion of composite-particles according to US 2012/0016060 A1.

FIG. 1 shows in a schematic manner how a continuous polymer matrix is formed incorporating dispersed silica particles during the process of US 2012/0016060 A1 so that composite particles are formed wherein in each composite particles a plurality of individual silica particles is incorporated in the continuous polymer matrix of said composite particle.

In the preparation of the composite particles used in the above-mentioned prior art, inorganic particles (e.g. silica) and/or precursors of inorganic materials were combined with polymer particles which have been prepared in advance. In contrast, in the method described in US 2012/0016060, composite particles are obtained by polymerization of ethylenically unsaturated monomers dispersed in an aqueous medium in the presence of at least one dispersely distributed, finely divided inorganic solid, e.g. silica. Without wishing to be bound to a specific theory, it is concluded that this difference in the preparation method results in a different structure of the composite particles so that the finely divided silica is spatially distributed within the polymer matrix of the composite particles, thus deviating from a common core-shell-structure.

Preparation of the CMP Slurry

A certain amount of deionized (DI) water (E) is firstly weighed in a plastic container. Then the container is placed on a magnetic stirrer plate and kept stirring at 60% maximum speed. A designated amount of glycine as complexing agent (B) and 1,2,4-triazole as corrosion inhibitor (C) (see below) are added into DI water in sequence while stirring till all solid dissolves. A designated amount of an aqueous dispersion of composite particles (A1) prepared as defined above and optionally further abrasive particles (A2) which are not composite particles (A1) is then added. The slurry pH is adjusted to certain value with diluted $HNO_3$ and KOH as pH adjusting agents (F), and the designated amount of $H_2O_2$ as oxidizing agent (D) is added into the solution, after which the above slurry is stirred for 30 minutes. Hereinbelow, the concentrations of slurry constituents are given in wt.-% based on the total weight of the respective slurry in each case.

8" Copper Blanket Wafer Polishing

8" blanket wafers (purchased from SKW Associates, Inc, diameter 8'=20.3 cm) are polished with Strasbaugh 6EG 200/300 mm CMP polisher. Polishing conditions are as the following (if not indicated otherwise): down pressure 2.5 psi (17.2 kPa), table speed/carrier speed 85 rpm/75 rpm, slurry flow rate 200 mL/min, and polishing time 1 minute. Polishing pads: Fujibo H800 (Shore A 20°-Shore A 60°); IC 1010K (Shore D) 57.6°. The copper removal rate is determined by measuring the difference in film thickness before and after the polishing using a four-point probe sheet resistance measurement system (ResMap 273).

8" Copper Patterned Wafer Polishing

Figure 2A:
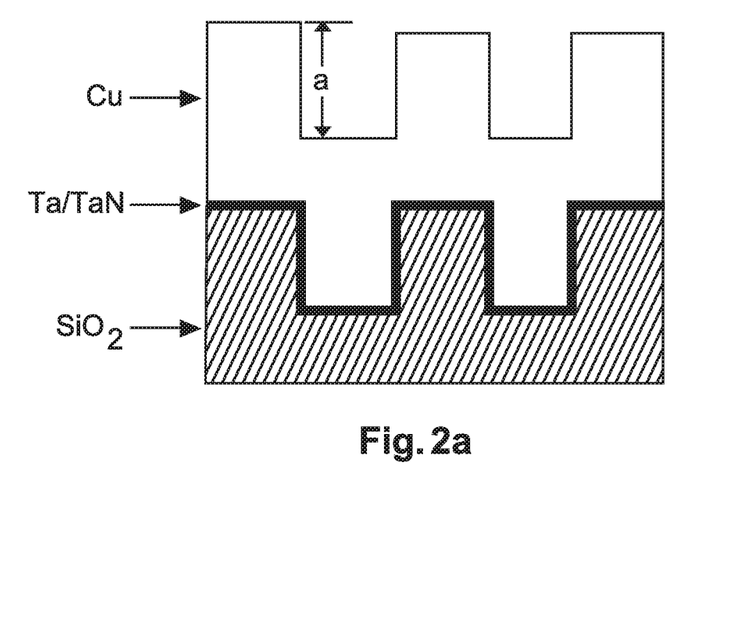
FIG. 2a copper topography of a patterned wafer before after polishing
FIG. 2b copper topography of a patterned wafer after polishing
FIG. 3 time dependence of the polishing result of different features of copper-patterned wafers.
Figure 2B:
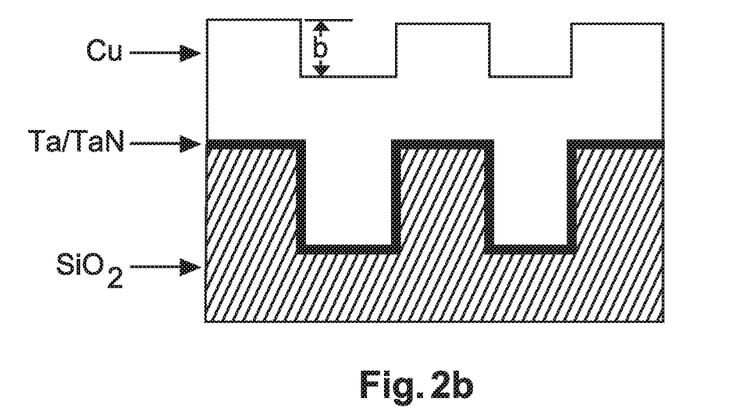

8" patterned wafers (SKW6-3.18C wafer, purchased from SKW Associates Inc. if not indicated otherwise, diameter 8"=20.3 cm) are polished with Strasbaugh 6EG 200 mm/300 mm CMP polisher. The copper topography (a) before and (b) after polishing is shown in FIG. 2a and FIG. 2b, resp.

Planarization efficiency was measured using step height reduction efficiency (SHRE) as shown in the equation:

$$SHRE_{feature} = \frac{\text{Copper Step Height}_{pre} - \text{Copper Step Height}_{post}}{\text{Removed Copper Thickness}}$$

wherein

Copper Step Height$_{pre}$ refers to the initial topography on copper patterned wafer, see FIG. 2a, wherein reference sign "a" denotes the Copper Step Height$_{pre}$ Copper Step Height$_{post}$: refers to the copper topography after polishing, see FIG. 2b wherein reference sign "b" denotes the Copper Step Height$_{post}$ Removed Copper Thickness: average film thickness removed on each die.

Polishing conditions are as follows (if not indicated otherwise): down pressure 2.5 psi (17.2 kPa), table speed/carrier speed 85 rpm/75 rpm, slurry flow rate 200 mL/min, and polishing time 1 min. Polishing pads: Fujibo H800 (Shore A 20°-Shore A 60°); IC 1010K (Shore D 57.6°). After polishing, step height, dishing and erosion are measured with a high-resolution stylus profiler meter, Ambios XP-2. For all of the above tests, 100 μm×100 μm, 50 μm×50 μm, 10 μm×10 μm features of edge, middle and center dies are measured.

Example 1

A CMP slurry 01 according to the invention comprising composite particles (A1) as abrasive particles and a CMP slurry 02 not according to the invention comprising conventional colloidal silica (A2) as abrasive particles were tested for chemical mechanical polishing of an 8" copper blanket wafer and of an 8" patterned wafer using a Fujibo H800 (3-1S) PET pad (Hardness: Shore A 57.5°), under the above-defined polishing conditions.

The formulation of the CMP slurries 01 and 02 is as follows:

Slurry 01: (A1) 1.0 wt.-% composite particles as described above; (B) 0.6 wt.-% Glycine; (C) 0.05 wt.-% 1,2,4-Triazole; (D) 1.5 wt.-% H$_2$O$_2$; (E) DI water; pH=5.40.

Slurry 02: (A2) 1.0 wt.-% colloidal silica (Nexsil 85K); (B) 0.6 wt.-% Glycine; (C) 0.05 wt.-% 1,2,4-Triazole; (D) 1.5 wt.-% H$_2$O$_2$; (E) DI water; pH=5.40.

The test results are shown in table 1.

CMP slurry 02 (not according to the invention) reached a high removal rate (MRR) for copper of ~5000 Å/min, however it achieved less than 50% planarization efficiency for 50 μm×50 μm feature size, and less than 15% planarization efficiency for 100 μm×100 μm feature size. In comparison, CMP slurry 01 comprising composite particles (A1) as defined above reaches both high removal rate MRR for copper of ~5000 Å/min and high step height reduction efficiency SHRE.

TABLE 1

| Slurry Formulation | MRR (Å/min) | SHRE for different feature sizes | | |
| --- | --- | --- | --- | --- |
| | | 100 μm × 100 μm | 50 μm × 50 μm | 10 μm × 10 μm |
| Slurry 01 | 5150 | 61% | 81% | 137% |
| Slurry 02 | 5064 | 13% | 48% | 113% |

Example 2

CMP slurries according to the invention comprising different concentrations of composite particles (A1) as abrasive particles were tested for chemical mechanical polishing of an 8" copper blanket wafer under the above-defined polishing conditions. Particular slurries were also tested for chemical mechanical polishing of an 8" patterned wafer under the above-defined polishing conditions using a Fujibo H800 (3-1S) PET pad. The concentration of above-described composite particles (A1) in each tested CMP slurry and the test results are shown in table 2. The other slurry components were the same for all tested slurries and are as follows:

(A2): 0.10 wt.-% colloidal silica; (B) 1.0 wt.-% Glycine; (C) 0.10 wt.-% 1,2,4-Triazole; (D) 1.2 wt.-% H$_2$O$_2$; (E) DI water; pH=6.00.

The copper MRR increases continually when the concentration of composite particles (A1) is decreased from 0.5 wt.-% to 0.01 wt.-%, while SHRE is most efficient at a concentrations of composite particles (A1) of 0.25 wt.-%.

TABLE 2

| | wt.-% of (A1) | | | | | | | |
| --- | --- | --- | --- | --- | --- | --- | --- | --- |
| | 0 | 0.10 | 0.15 | 0.20 | 0.25 | 0.30 | 0.40 | 0.50 |
| MRR (Å/min) (Central die of 8" copper patterned wafer is taken as reference) | 7154 | 10025 | 9518 | 7061 | 3343 | 2813 | 1751 | 1454 |
| SHRE (100 μm × 100 μm) | 13% | — | — | 17% | 38% | — | — | — |
| SHRE (50 μm × 50 μm) | 20% | — | — | 38% | 59% | — | — | — |
| SHRE (10 μm × 10 μm) | 96% | — | — | 105% | 152% | — | — | — |

Example 3

For the evaluation of the chemical mechanical polishing selectivity, a CMP slurry according to the invention was tested for chemical mechanical polishing of blankets of copper and several materials selected from the group consisting of diffusion barrier materials and dielectric materials under the above-defined polishing conditions (except for the down pressure which is indicated in table 3) using a Fujibo H800 PET pad. The MRR values for each material under two different down pressures are shown in table 3. The slurry composition is as follows:

(A1) 1.0 wt.-% composite particles as described above (B) 0.6 wt.-% Glycine; (C) 0.05 wt.-% 1,2,4-Triazole; (D) 1.5 wt.-% $H_2O_2$; (E) DI water; pH=5.40.

The CMP composition according to the invention exhibits a very high selectivity for removing copper in relation to the tested barrier material tantalum nitride as well as to the tested dielectric materials silicon dioxide and low-K dielectric, such as Black Diamond® available from Applied Materials.

TABLE 3

| MRR/ (Å/min) | Material | | | |
|---|---|---|---|---|
| | Cu | TaN | silicon dioxide obtained by plasma-enhanced chemical vapor deposition using tetraethoxy-silane (TEOS) as precursor | Black Diamond ® |
| at down pressure of 2.5 psi (17.2 kPa) | 7871 | 30 | 13 | 34 |
| at down pressure of 1.5 psi (10.3 kPa) | 4062 | 14 | 2 | 13 |

Example 4

A CMP slurry according to the invention was tested for chemical mechanical polishing of an 8" SEMATECH 854 copper patterned wafer under the above-defined polishing conditions, and the step height of different feature sizes was measured after different polishing times. The slurry composition is as follows:

(A1) 1.0 wt.-% composite particles as described above; (B) 0.6 wt.-% Glycine; (C) 0.05 wt.-% 1,2,4-Triazole; (D) 1.5 wt.-% $H_2O_2$; (E) DI water; pH=5.40.

Figure 3:
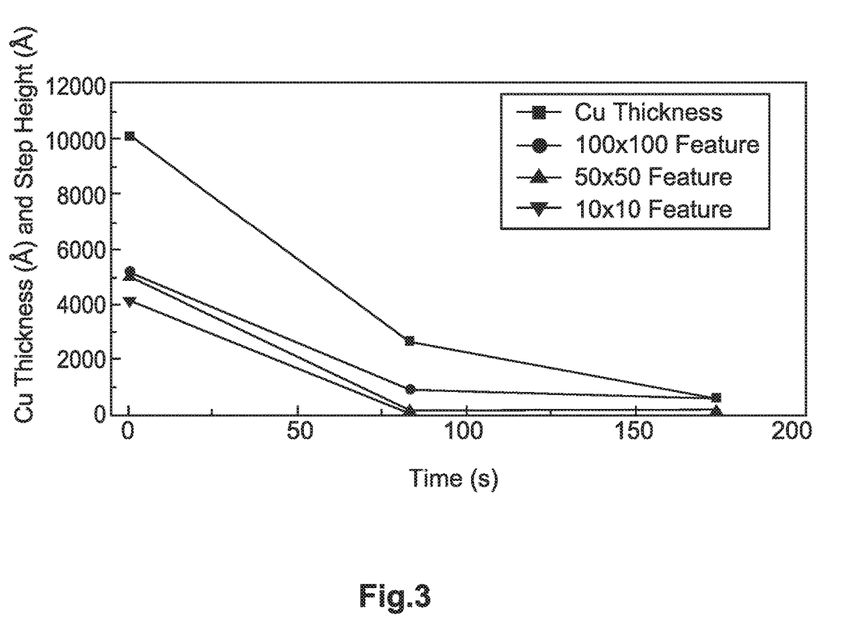

The test results are shown in table 4 and FIG. 3. The smaller feature (10 μm×10 μm size) was fully planarized after 83 sec of polishing. However, the large feature (100 μm×100 μm) showed about 500 Å step height after 173 sec polishing. With the 50 μm×50 μm feature, dishing was observed after 173 sec of polishing.

TABLE 4

| Thickness and Step Height | Time (sec) | | |
|---|---|---|---|
| | 0 | 83 | 173 |
| Copper Thickness (Å) | 10132 | 2669 | 569 |
| Step Height (100 μm × 100 μm) | 5100 | 904 | 572 |
| Step Height (50 μm × 50 μm) | 5000 | 156 | 216 |
| Step Height (10 μm × 10 μm) | 4100 | 0 | 0 |

Example 5

For the evaluation of the influence of the hardness of the pad, a CMP slurry according to the invention was tested for chemical mechanical polishing of an 8" copper blanket wafer and of an 8" patterned wafer under the above-defined polishing conditions using pads of different hardness as indicated in table 5. The slurry composition is as follows:

(A1) 0.2 wt.-% composite particles as described above; (A2) 0.1 wt.-% colloidal silica (Fuso PL-3); (B) 0.8 wt.-% Glycine; (C) 0.2 wt.-% 1,2,4-Triazole; (D) 1.5 wt.-% $H_2O_2$; (E) DI water; pH=5.40.

The test results are shown in table 5.

The removal rate MRR for copper as well as the step height reduction efficiency SHRE depend on the pad hardness. While the removal rate MRR for copper is higher with the soft pad, with hard pads a higher step height reduction efficiency is achieved for feature sizes 110 μm×100 μm and 50 μm×50 μm. For hard pads the SHRE does not change significantly with the feature size while for soft pads the SHRE increases when the feature size decreases, so that for 10 μm×10 μm features there is no significant difference in SHRE for hard pad and soft pad. Thus, with the CMP composition according to the present invention, soft pads can be used instead of hard pads for polishing copper-patterned wafers especially with feature sizes of 50 μm×50 μm and below.

TABLE 5

| Pad | MRR (Å/min) | SHRE for different feature sizes | | |
|---|---|---|---|---|
| | | 100 μm × 100 μm | 50 μm × 50 μm | 10 μm × 10 μm |
| 8" IC1010K Shore D 57.6° ("hard pad") | 4739 | 138% | 140% | 132% |
| 8" Fujibo H800(3-1S) NW Shore A 57.5° (soft pad") | 6968 | 17% | 45% | 120% |

The invention claimed is:

1. A chemical-mechanical polishing (CMP) composition, comprising:
   (A) an amount of abrasive particles consisting of
      (A1) an amount of composite particles wherein each composite particle comprises
         (i) a continuous matrix phase comprising an addition polymer of one or more ethylenically unsaturated monomers; and
         (ii) one or more dispersed phases dispersed in the continuous matrix phase and each consisting of a plurality of divided phase domains consisting of inorganic solid material; and
      (A2) optionally an amount of further abrasive particles which are not composite particles (A1);
   (B) one or more complexing agents;
   (C) one or more corrosion inhibitors;
   (D) one or more oxidizing agents; and
   (E) water,
      wherein the amount of the composite particles (A1) is not more than 0.5% by weight, and the amount of the further abrasive particles (A2) is not more than 0.1% by weight, based on a total weight of the composition.

2. The composition according to claim 1, wherein the divided phase domains of at least one of the dispersed phases (ii) have a longest dimension which is 25% or less of the average particle size of the composite particles (A1).

3. The composition according to claim 1, wherein the continuous matrix phase (i) of the composite particles (A1) comprises an addition polymer selected from the group consisting of (meth)acrylic polymers.

4. The composition according to claim 1, wherein the divided phase domains of at least one of the dispersed phases (ii) consist of inorganic solid material selected from the group consisting of silicon dioxide, phyllosilicates, aluminum oxide, hydroxyaluminum oxide, calcium carbonate, magnesium carbonate, calcium orthophosphate, magnesium orthophosphate, iron(II) oxide, iron (III) oxide, iron(II/III) oxide, tin(IV) oxide, cerium(IV) oxide, yttrium(III) oxide, titanium dioxide, hydroxylapatite, zinc oxide, and zinc sulfide.

5. The composition according to claim 1, wherein
the composite particles (A1) have an average particle size in a range of from more than 10 nm to not more than 1000 nm,
and/or
the divided phase domains of at least one of the dispersed phases (ii) each consist of a particle of inorganic solid material having an average particle size of more than 0 nm and not more than 100 nm.

6. The composition according to claim 1, wherein the composite particles (A1) are produced by a process comprising
a) providing
an aqueous medium,
an amount of one or more ethylenically unsaturated monomers,
one or more inorganic solid materials having an average particle size of 100 nm or below in a total amount of 1% to 1000% by weight of the total amount of the one or more ethylenically unsaturated monomers,
and
one or more free-radical polymerization initiators in a total amount of 0.05% to 2% by weight of the total amount of the one or more ethylenically unsaturated monomers,
b) including in an initial charge at least a portion of the one or more inorganic solid materials into the aqueous medium so that an aqueous dispersion comprising one or more dispersed phases each consisting of a plurality of divided phase domains consisting of inorganic solid material is formed,
c) subsequently metering into the aqueous dispersion formed in b)
0.01% to 20% by weight of the total amount of the one or more ethylenically unsaturated monomers provided in a) and
60% by weight or more of the total amount of the one or more free-radical polymerization initiators provided in a)
and polymerizing under polymerization conditions the one or more ethylenically unsaturated monomers metered in, up to a monomer conversion of 80% by weight or more (polymerization stage 1) so that a polymerization mixture is formed,
d) subsequently, under polymerization conditions metering into the polymerization mixture formed in c)
any remainder of the one or more inorganic solid materials,
any remainder of the one or more free-radical polymerization initiators, and
the remainder of the one or more ethylenically unsaturated monomers, and carrying out polymerization to a monomer conversion of 90% or more by weight of the monomers metered in d) (polymerization stage 2).

7. The composition according to claim 1, wherein at least one of the complexing agents (B) is an organic acid, an inorganic acid, or both.

8. The composition according to claim 1, wherein at least one of the corrosion inhibitors (C) is an azole.

9. The composition according to claim 1, wherein at least one of the oxidizing agents (D) is at least one selected from the group consisting of peroxides, persulfates, perchlorates, perbromates, periodates and permanganates.

10. The composition according to claim 1, having a pH value in a range of from 4 to 9.

11. The composition according to claim 10, further comprising:
(F) one or more pH adjusting agents.

12. The composition according to claim 1, wherein
the amount of the composite particles (A1) is in a range of from 0.05 to 0.5 wt.-% based on the total weight of the composition,
and/or
an amount of the one or more complexing agents (B) is in a range of from 0.05 to 5 wt.-% based on the total weight of the composition,
and/or
an amount of the one or more corrosion inhibitors (C) is in a range of from 0.001 to 0.5 wt.-% based on the total weight of the composition,
and/or
an amount of the one or more oxidizing agents (D) is in a range of from 0.1 to 2 wt.-% based on the total weight of the composition.

13. The composition according to claim 1, wherein the composition is in the form of a slurry.

14. The composition according to claim 1, wherein the composition includes not more than 0.40% by weight of the composite particles (A1), not more than 5% by weight of the complexing agents (B), not more than 0.5% by weight of the corrosion inhibitors (C), and not more than 2% by weight of the oxidizing agents (D), based on the total weight of the composition.

15. The composition according to claim 14, wherein remainder of the composition is water.

16. The composition according to claim 1, wherein the composition includes 0.05 to 0.30% by weight of the composite particles (A1), 0.05 to 5% by weight of the complexing agents (B), 0.001 to 0.5% by weight of the corrosion inhibitors (C), and 0.1 to 2% by weight of the oxidizing agents (D), based on the total weight of the composition.

17. The composition according to claim 1, wherein at least one of the corrosion inhibitors (C) is selected from the group consisting of benzotriazole, methyl-benzotriazole, 1,2,4-triazole, pyrrolidone, imidazole, poly vinyl pyrrolidone, poly vinyl imidazole, tetrazole, 1,2,3-triazole, 5-phenyl tetrazole, 3-amino-1,2,4-triazole, and benzimidazole.

18. A process for manufacturing a semiconductor device, comprising:
chemical mechanical polishing a substrate with the composition of claim 1 while applying the composition onto the substrate as a continuous stream or in dropwise fashion.

19. The process according to claim 18, wherein the substrate comprises a surface region or a layer consisting of copper or of a copper-based alloy.

20. A process, comprising:
chemical-mechanical polishing a substrate with a composition comprising an amount of composite particles (A1) and water (E) while applying the composition onto the substrate as a continuous stream or in dropwise fashion, wherein each of the composite particles (A1) comprises
(i) a continuous matrix phase comprising an addition polymer of one or more ethylenically unsaturated monomers;
and
(ii) one or more dispersed phases dispersed in the continuous matrix phase and each consisting of a plurality of divided phase domains consisting of inorganic solid material.

* * * * *

UNITED STATES PATENT AND TRADEMARK OFFICE
CERTIFICATE OF CORRECTION

PATENT NO. : 10,214,663 B2
APPLICATION NO. : 15/502932
DATED : February 26, 2019
INVENTOR(S) : Yongqing Lan et al.

It is certified that error appears in the above-identified patent and that said Letters Patent is hereby corrected as shown below:

In the Specification

Column 5, Line 48, "$C_1$-$C_{15}$" should read -- $C_1$-$C_{18}$ --

Column 5, Line 54, "$C_1$-$C_5$" should read -- $C_1$-$C_8$ --

Column 8, Line 16, "a monomer conversion of 90% by weight" should read -- a monomer conversion of ≥ 90% by weight --

Signed and Sealed this
Sixteenth Day of June, 2020

Andrei Iancu
*Director of the United States Patent and Trademark Office*